(12) United States Patent
Turner

(10) Patent No.: US 6,248,949 B1
(45) Date of Patent: Jun. 19, 2001

(54) METHOD OF MANUFACTURING A SOLAR CELL RECEIVER PLATE OF A CONCENTRATOR PHOTOVOLTAIC ARRAY

(76) Inventor: Gerald A. Turner, 3178 Eucalyptus Ave., Long Beach, CA (US) 90802

( * ) Notice: Subject to any disclaimer, the term of this patent is extended or adjusted under 35 U.S.C. 154(b) by 0 days.

(21) Appl. No.: 09/428,433

(22) Filed: Oct. 28, 1999

(51) Int. Cl.$^7$ .......................... H01L 31/05; H01L 31/042
(52) U.S. Cl. ...................... 136/244; 136/256; 136/246; 136/293; 438/73; 438/83; 438/98; 438/66; 438/80; 438/67
(58) Field of Search ............................ 136/246, 256, 136/293, 244; 438/73, 83, 67, 98, 66, 80

(56) References Cited

U.S. PATENT DOCUMENTS 5,125,983 * 6/1992 Cummings ..................... 136/246
6,020,555 * 2/2000 Garboushian et al. .......... 136/256

* cited by examiner

Primary Examiner—Alan Diamond
(74) Attorney, Agent, or Firm—Charles C. Logan II

(57) ABSTRACT

An improved method of manufacturing a solar cell receiver plate of a concentrator photovoltaic array. A plurality of strips each having its own linear electrical circuit are connected to the top surface of a primary aluminum substrate. The strips are aligned parallel to each other and laterally spaced from each other a predetermined distance. Each strip has a plurality of solar cells mounted thereon. The electrical circuits are connected together in series. Cooling fins are secured to the bottom surface of the primary aluminum substrate. The strips have been formed from a secondary aluminum substrate that had its dielectric layer adhered to its top surface by a layer of adhesive. A second layer of adhesive covers the top surface of the dielectric layer which in turn is covered by a sheet of copper to form a laminated first assembly. Eighteen strips each having their own electrical circuit on their top surface are formed on the top surface of the laminated first assembly by chemically etching away all of the unwanted copper. The strips are then segmented from the laminated first assembly and utilized on the solar cell receiver plate for a concentrator photovoltaic array. An alternate method of forming the individual strips utilizes extruded aluminum strips for the secondary aluminum substrates and stamped copper electrical circuit strips.

10 Claims, 6 Drawing Sheets

Figure 1 - Prior Art

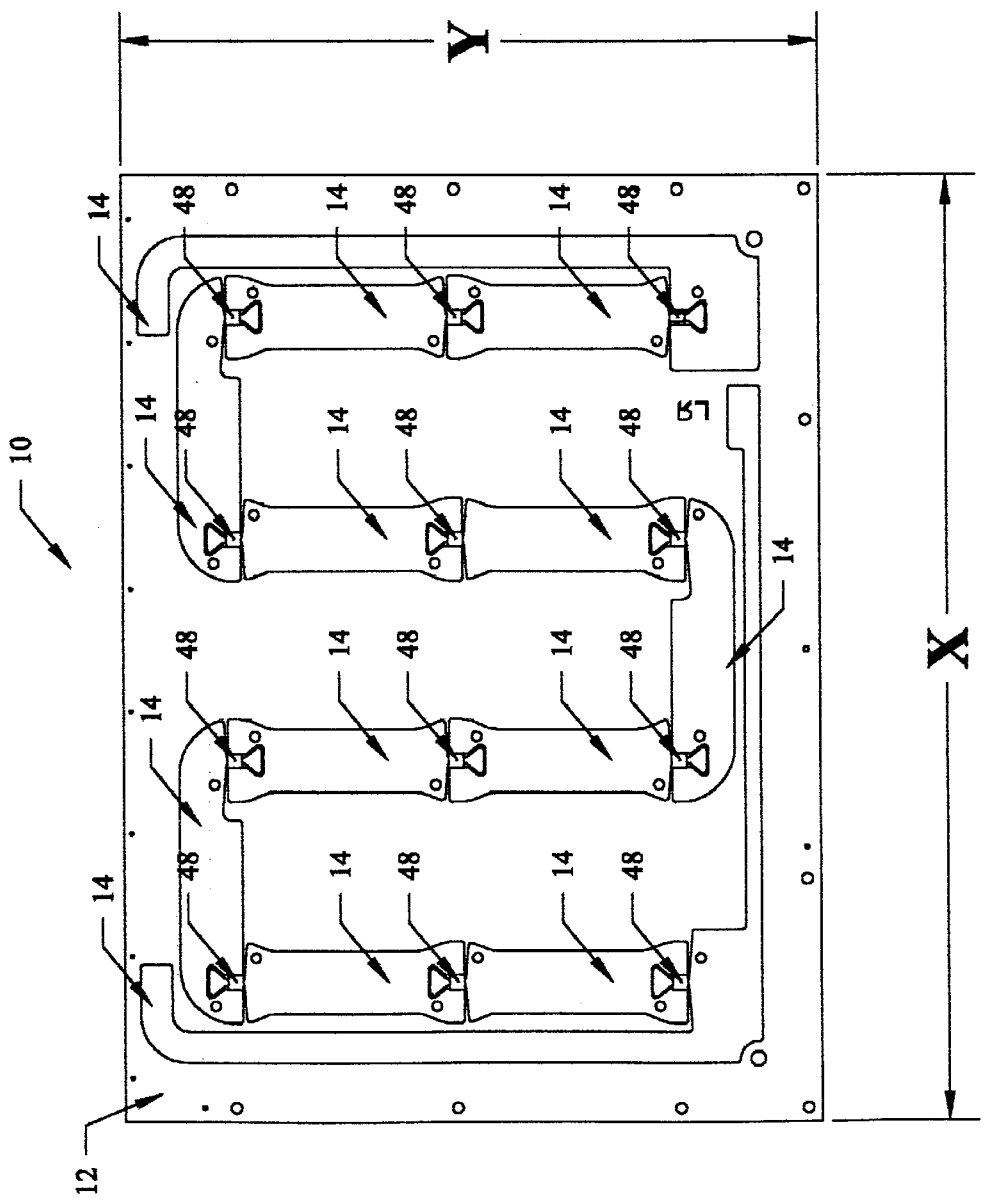
Figure 3 - Prior Art

METHOD OF MANUFACTURING A SOLAR CELL RECEIVER PLATE OF A CONCENTRATOR PHOTOVOLTAIC ARRAY

BACKGROUND OF THE INVENTION

1. Field of the Invention

The present invention relates to the method of installing surface mount solar cells in the receiver plate section of a concentrator photovoltaic array. More specifically, the present invention relates to a configuration, and the associated manufacturing processes to provide a mounting surface, electrical interconnects, ancillary optical elements, passivation, and alignment of the foregoing, to facilitate the incorporation of surface mount (chip or wafer type devices in which the electrical contacts are located in a single plane, and are soldered or otherwise bonded to a mating plainer electrical contact forming simultaneously a physical and electrical attachment) solar cells into the receiver plate section of a concentrator photovoltaic array.

2. Prior Art

Several advantages can be realized by interposing a lens between the sun and a solar cell in a photovoltaic application. By the use of such a lens, the energy collected over a large area can be concentrated upon a single solar cell which will produce as much or more power than would be produced by a field of solar cells equal in area to that of the lens. Special solar cells have been developed which take advantage of the higher energy per unit area to convert this solar energy to electricity with greater efficiency than can be realized at the single sun level.

Despite the increased efficiency afforded by concentration, typically in the 50X to 500X concentration ratios, the majority of the incoming energy must be removed in the form of heat. To accomplish this feat, special care is given to the selection of materials and configuration of the receiver section, that portion of the solar array which collects, converts, and distributes the solar energy in the form of electricity. Previous arrays have been manufactured using heavy copper sheet laminated to an aluminum substrate with an intervening dielectric layer. The circuitry, which distributes the electricity from the solar cells which are soldered to this copper layer, is formed by chemically etching away all of the unwanted copper. The heavy copper and the dielectric materials including the adhesives used for lamination are selected to provide the maximum heat transfer, consistent with electrical isolation, from the copper circuitry to the aluminum substrate where it is dissipated by cooling fins attached to the back of the substrate which now becomes the receiver plate.

The copper, dielectric material, and adhesive are relatively expensive when compared to conventional etched circuit designs. Furthermore, the entire surface of the substrate must be covered with these expensive materials prior to defining the circuitry by etching. A very large fraction of the applied copper sheet is then converted to solution form which must be handled, as hazardous waste. If a pinhole failure should occur in the dielectric during the lamination process the entire receiver plate is lost. All of these factors add up to a high manufacturing cost for this technology.

SUMMARY OF THE INVENTION

The principal object of the present invention is to reduce overall manufacturing costs for concentrator receiver plate assemblies. These cost reductions include, direct material costs, assembly costs, and initial equipment costs. It is also the objective of the invention to facilitate manufacturing operations, and improve yields by reducing the physical size of the smallest measurable (performance) subassembly in the receiver assembly.

The foregoing objects can be accomplished, utilizing the proven manufacturing methods and materials by increasing the circuit density of the substrate, and subsequently segmenting and reassembling the substrate upon a lightweight carrier to produce a receiver plate with the same spatial relationship between individual cells as the former single substrate receiver plate. This segment and reassembly concept applies to any combination of cells that may be envisioned as a subassembly to the receiver plate assembly. Each segment requires an external interconnect to connect it to the next segment in the receiver plate circuit. A strip consisting of four solar cells including ancillary optics is an optimal configuration for a receiver plate which will be matched to a four by six parquet of Fresnel lenses, and will be used hereinafter to describe the invention.

The narrow strip permits smaller, less costly manufacturing equipment such as solder reflow furnaces, flux removal systems, and coating machines used for the application of passivation coatings. By testing the receiver plates in four cell subassemblies, the liability of any damaged cell is limited to a single subassembly rather than a completed receiver plate. Field repair of damaged receiver plates is made possible by the replacement of a single four cell subassembly. Such replacements are not possible with individual solar cells soldered directly to the un-segmented receiver plate/substrate.

DESCRIPTION OF THE DRAWINGS

FIG. 3 is a top plan view of the prior art laminated first assembly that forms the receiver plate with a plurality of solar cells electrically connecting the respective copper electrical circuit members;

DESCRIPTION OF THE PREFERRED EMBODIMENT

The novel improved method of manufacturing a solar cell receiver plate of a concentrator photovoltaic array will now be described by referring to FIGS. 1–6 of the drawings.

Figure 1:
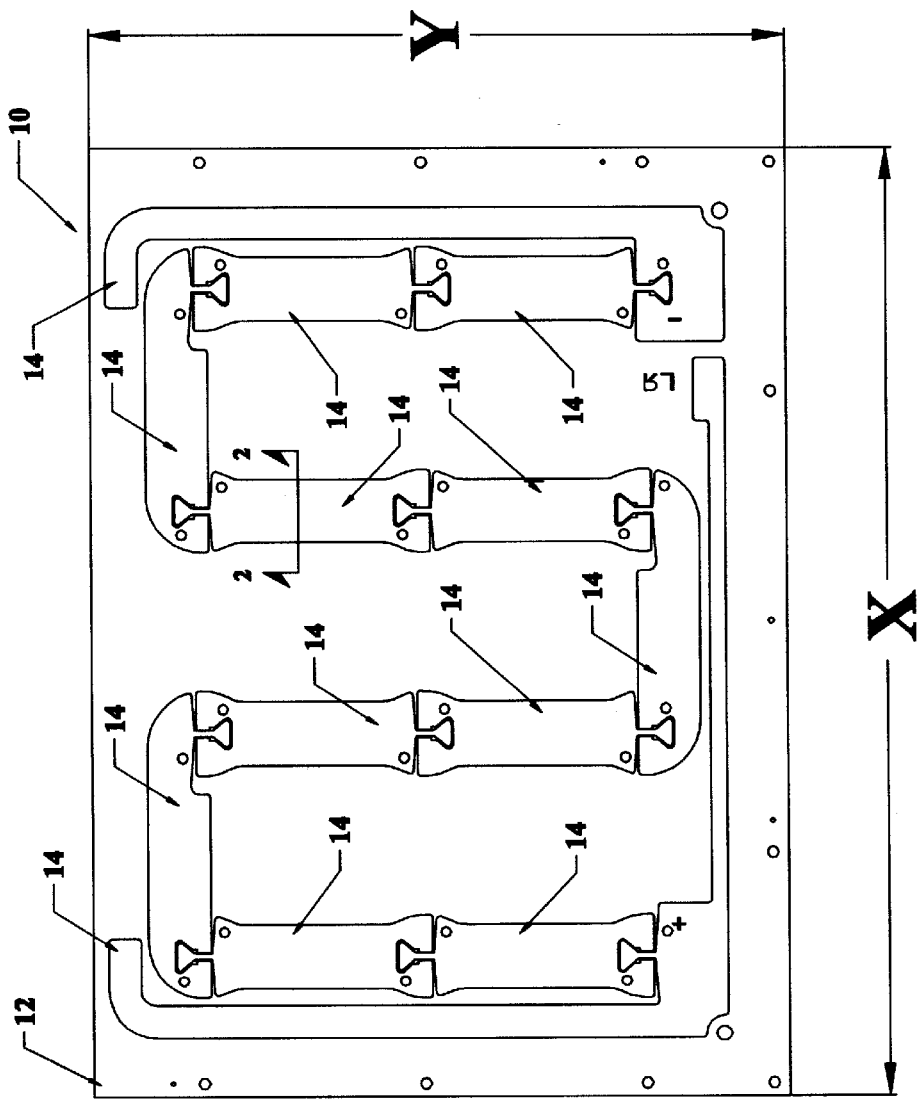
FIG. 1 is a top plan view of a prior art laminated receiver plate with the copper electrical circuit formed thereon by etching the top surface of the copper sheet that previously covered the entire primary aluminum substrate.
Figure 2:
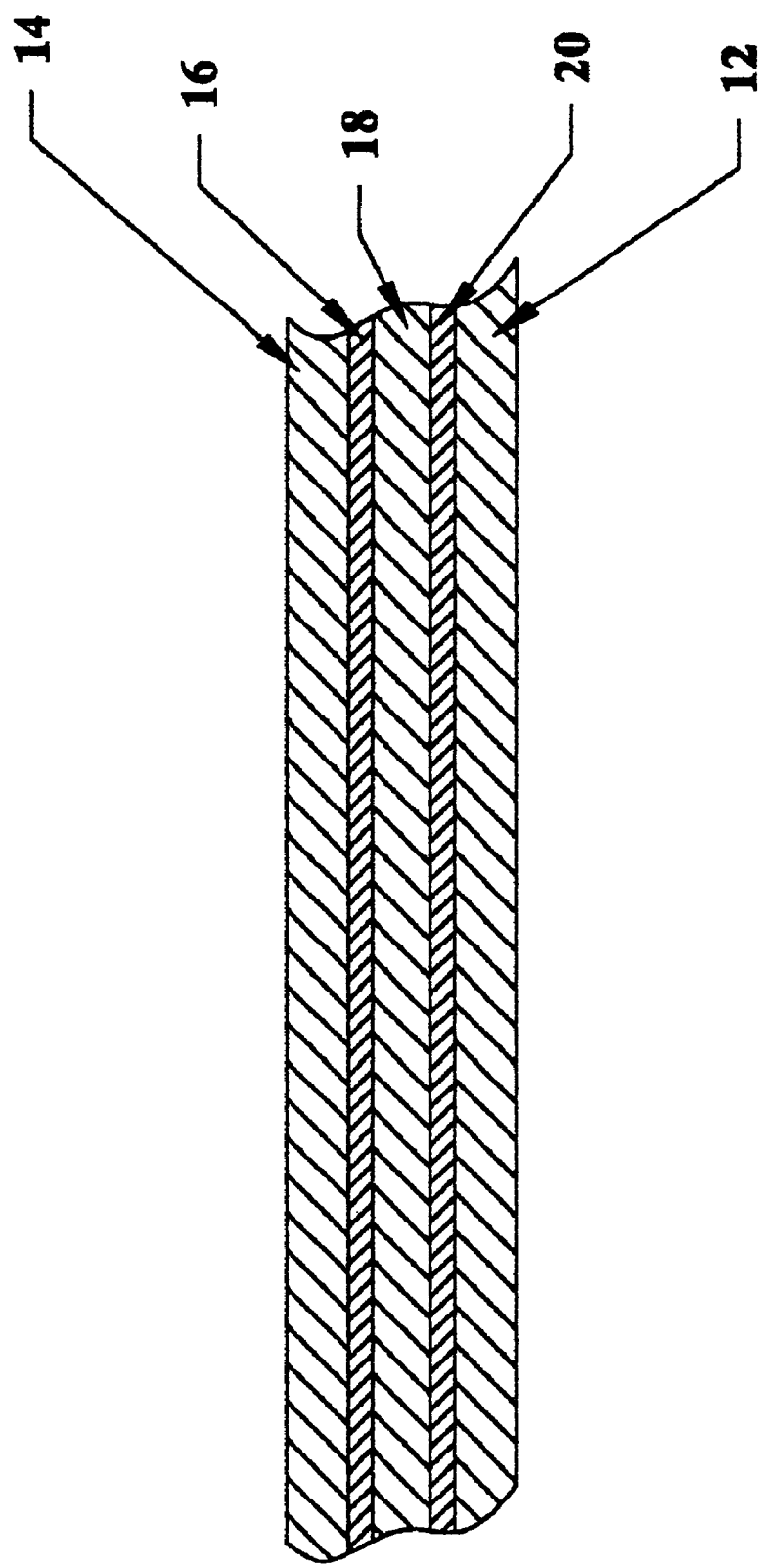
FIG. 2 is an enlarged partial vertical cross sectional view of the laminated first assembly from which the prior art receiver plate was formed and it also illustrates the vertical cross section of the laminated first assembly utilized with the new method of manufacture described in this application.

In FIGS. 1–3 the prior art receiver plate 10 is illustrated. It has had predetermined portions of its copper top surface chemically etched away of all unwanted copper, to form copper electrical circuit members 14 of an electrical circuit. FIG. 2 is a vertical cross section taken along lines 2—2 of FIG. 1 of receiver plate 10. It shows an aluminum substrate 12, a layer of adhesive 20, a dielectric layer 18, a layer of adhesive 16, and a layer of copper 14. A receiver plate 10 prior to being chemically etched is a first laminated assembly and it would have had a cross section the same as illustrated in FIG. 2 across its entire width and length.

In FIG. 3 the prior art solar cell receiver plate is illustrated having a length X and width Y. X is in the range of 20–40 inches and Y is in the range of 12–30 inches. The copper electrical circuit members 14 are electrically connected to each other by solar cells 48.

The prior art receiver plate 10 illustrated in FIGS. 1 and 3 has had over 50 percent of its top layer of copper etched away resulting in a toxic solution that has to be treated as hazardous waste for disposal purposes.

Figure 4A:
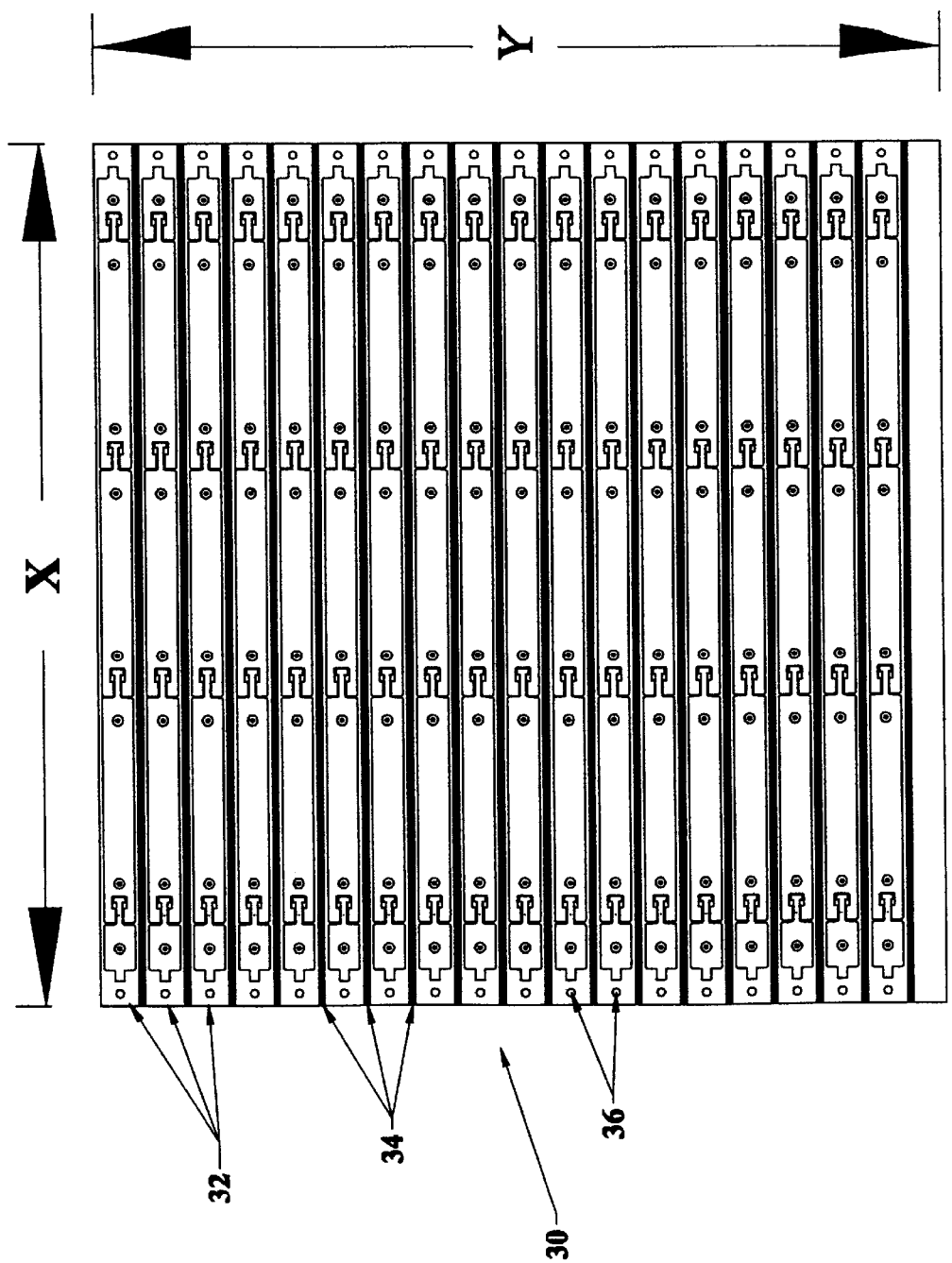
FIG. 4A is a top plan view of the novel laminated first assembly after chemically etching away all of the unwanted copper in the top surface of the laminated first assembly and schematically illustrating an electrical circuit on each of the individual strips.
Figure 4B:
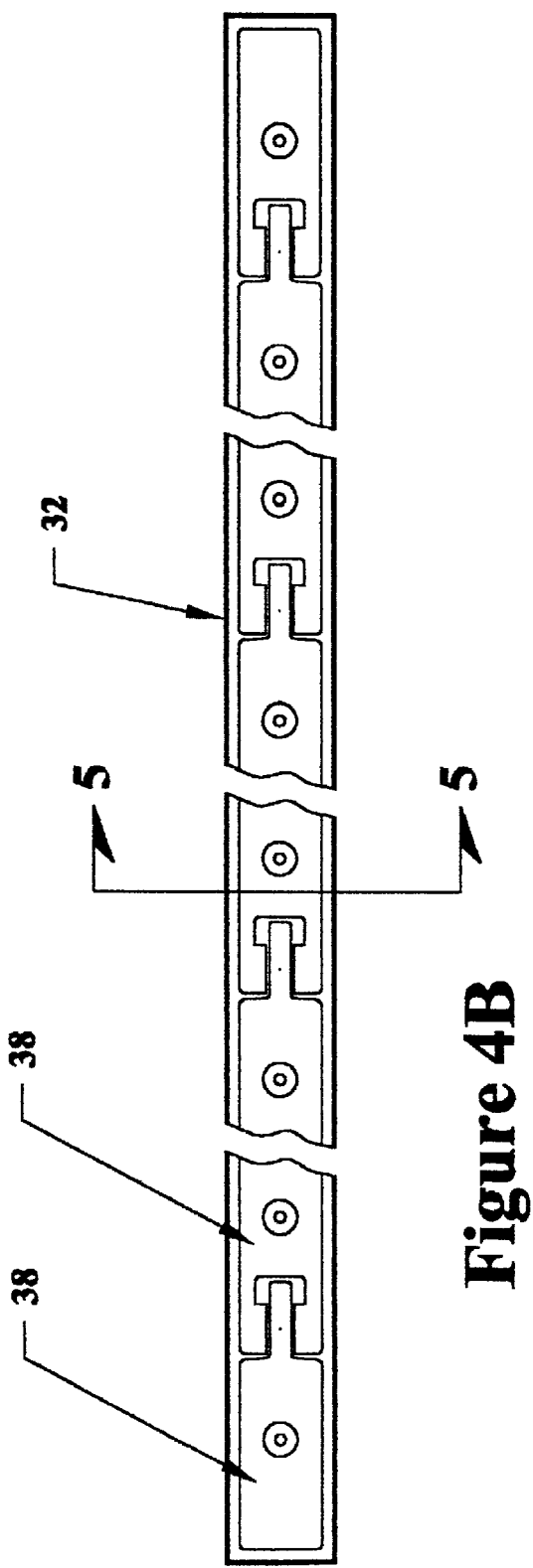
FIG. 4B is an enlarged top plan view of one of the strips formed by etching away all of the unwanted copper in the top surface of the laminated first assembly and thereby forming an electrical circuit to which solar cells would be attached.
Figure 5:
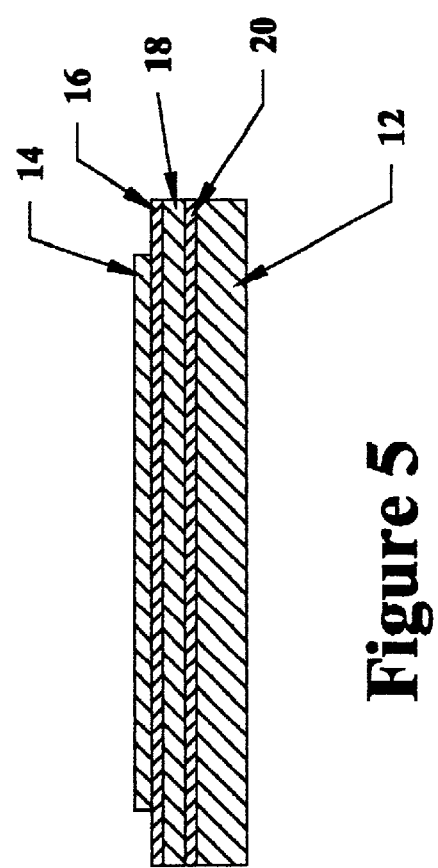
FIG. 5 is a cross sectional view taken along lines 5—5 of FIG. 4B.

In FIG. 4A, a first laminated assembly 30 is illustrated having a length X and a width Y. Assembly 30 initially started having an aluminum substrate 12, an adhesive layer 20, a dielectric layer 18, a layer of adhesive 16 and a sheet of copper 14. FIG. 4A illustrates the first laminated assembly 30 after all of the unwanted copper has been chemically etched away to form eighteen strips 32 separated by the darkly shaded areas 34 that are "slug" areas to be blanked. The individual strips 32 have apertures 36 formed at each end so that they can be fastened to the top surface of a receiver plate 42. The cross hatching of each strip 32 schematically denotes a printed linear electrical circuit. FIG. 4B is an enlarged top plan view of one of the strips 32 showing the etched copper electrical circuit members 38. The individual strips 32 would be segmented or cut from the first laminated assembly 30 to be used later in the assembly of the novel solar cell receiver plate 42. FIG. 5 is a cross sectional view of the individual strips 32.

Figure 6:
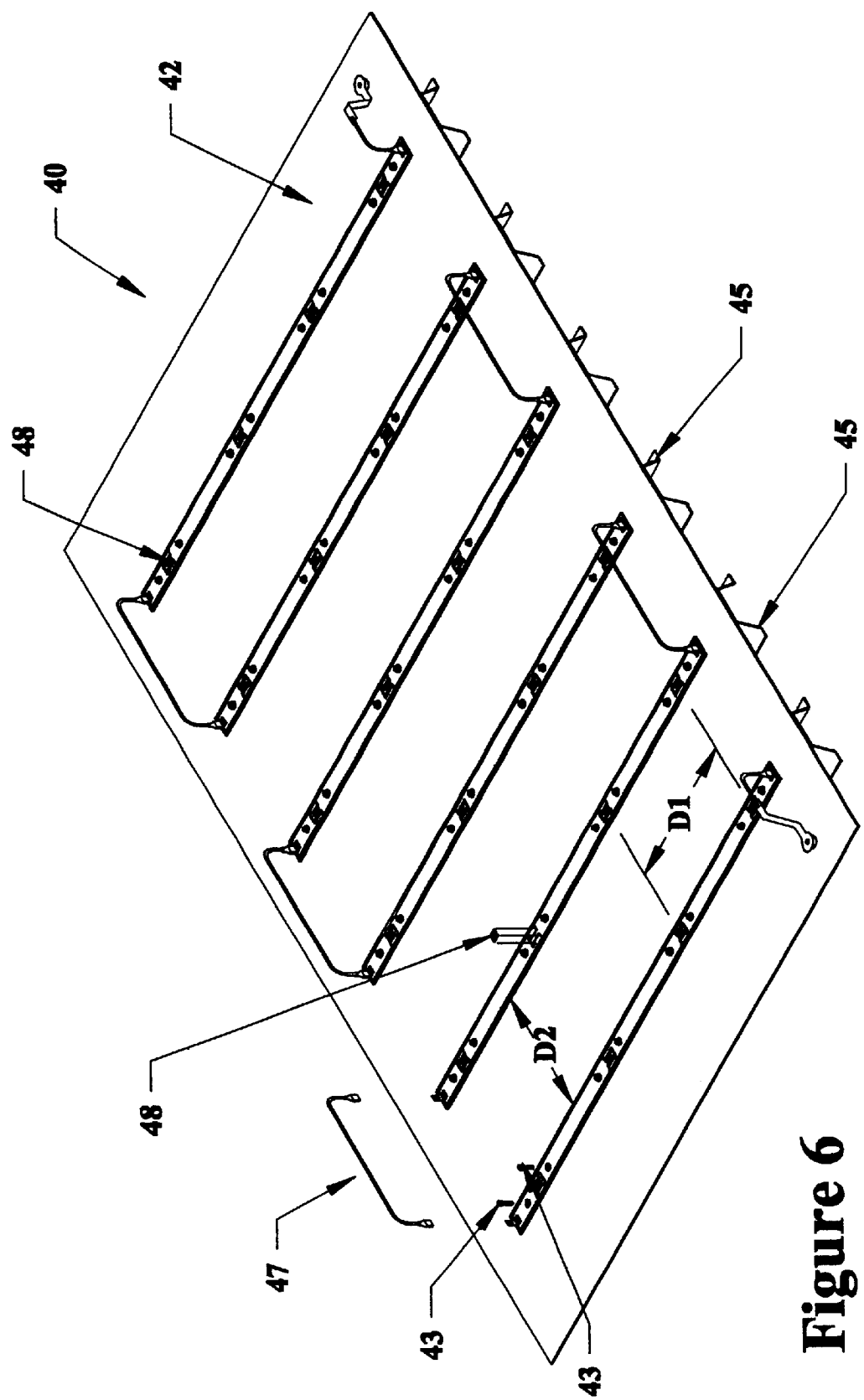
FIG. 6 is a front perspective view illustrating the novel assembled solar cell receiver plate of a concentrator photovoltaic array.

A partially assembled novel solar cell receiver plate 40 is illustrated in FIG. 6. It has a length X and a width Y. It has an aluminum substrate 42 and a plurality of the strips 32 are arranged parallel to each other and laterally spaced along the length of the substrate 42. Screws 43 are used to fasten strips 32 and cooling fins 45 to aluminum substrate 42. External electrical connector members 47 are used to connect the respective strips in series. Four solar cells 48 would be connected to the top surface of the electrical circuit on each of the strips 32 (although only one of the solar cells is illustrated in FIG. 6). The spacing between the solar cell 48 on each of the strips 32 would be D1 and D1 is in the range of 5–12 inches. The distance between the respective strips 32 is D2 and D2 is in the range of 5–12 inches.

An alternative method of manufacturing solar cell plate 40 would involve only minor changes. Instead of forming strips 32 by initially forming a first laminated first assembly that would require its top copper layer to be etched, strips 32 would be formed in the following manner. Aluminum strips 12 as seen in FIG. 5 would be formed by extrusion. The copper electrical circuit strips would be stamped out of a sheet of cooper. The strips 32 would be formed by applying a layer of adhesive 20 onto the top surface of the aluminum strip 12. Next a layer of dielectric material 18 would be applied and a layer of adhesive 16 applied to its top surface. Lastly the stamped copper electrical circuit strips 38 would be placed on the top surface of adhesive layer 16 to form a laminated strip assembly 32. These strips would be attached to aluminum substrate 42 in the same manner as described previously and also illustrated in FIG. 6.

What is claimed is:

1. An improved method of manufacturing a solar cell receiver plate of a concentrator photovoltaic array comprising the following steps:

(a) taking a secondary aluminum substrate having a top surface and having a length X and a width Y and covering said top surface first with a first layer of adhesive; following this a dielectric layer having a top surface is placed on said first layer of adhesive;

(b) next a second layer of adhesive is applied to said top surface of said dielectric layer and following this a copper sheet is placed on said second layer of adhesive to form a laminated first assembly;

(c) applying a photo resist coating to the top surface of said laminated first assembly and forming strips, each having its own linear electrical circuit, in said top surface of said first assembly by chemically etching away all of the unwanted copper in said top surface of said first assembly; said strips having a length substantially equal to X and a width Y/n where n is greater than 6;

(d) segmenting said strips from said laminated first assembly;

(e) fastening two or more of said strips to the top surface of a primary aluminum substrate to form a receiver plate for a concentrator photovoltaic array;

(f) mounting a plurality of solar cells on the electrical circuit of each of said strips; and (g) electrically connecting the electrical circuits of said strips together.

2. An improved method of manufacturing a solar cell receiver plate as recited in claim 1 further comprising the following step:

(h) attaching cooling fins to the bottom surface of said primary aluminum substrate.

3. An improved method of manufacturing a solar cell receiver plate as recited in claim 1 wherein the electrical circuits of said strips are electrically connected together in series.

4. An improved method of manufacturing a solar cell receiver plate as recited in claim 1 wherein less than 30% of said copper sheet is etched away.

5. A solar cell receiver plate comprising:

a primary aluminum substrate having a top surface, a length X and a width Y;

a plurality of elongated strips each having its own linear electrical circuit on its top surface; said strips being laterally spaced from each other across the length X of said aluminum substrate; the electrical circuits of said strips being electrically connected together; said strips being spaced from each other a distance D1, wherein D1 is in the range of 3–10 inches; said strips being fastened to said primary substrate;

each of said strips having a secondary aluminum substrate having a top surface with a first layer of adhesive covering said top surface of said secondary aluminum substrate; a dielectric layer is positioned on said first layer of adhesive; a second layer of adhesive covers said top surface of said dielectric layer; a layer of copper in the form of a printed electrical circuit is positioned on said second layer of adhesive; and a plurality of solar cells are mounted on each of said strips on the electrical circuits.

6. A solar cell receiver plate as recited in claim 5 further comprising a plurality of cooling fins connected to the bottom surface of said primary aluminum substrate.

7. A solar cell receiver plate as recited in claim 5 wherein the electrical circuits of said strips are electrically connected together in series.

8. An improved method of manufacturing a solar cell receiver plate of a concentrator photovoltaic array comprising the following steps:

(a) taking an extruded secondary aluminum substrate strip having a top surface and covering said top surface first with a first layer of adhesive and following this a dielectric layer having a top surface is placed on said first layer of adhesive;

(b) next a second layer of adhesive is applied to said top surface of said dielectric layer and following this a stamped copper electrical circuit strip is placed on said second layer of adhesive to form a strip shaped laminated first assembly;

(c) fastening two or more of said strip shaped laminated first assemblies to the top surface of a primary aluminum substrate to form a receiver plate for a concentrator photovoltaic array;

(d) mounting a plurality of solar cells on the electrical circuit of each of said strip shaped laminated first assemblies; and (e) electrically connecting the electrical circuits of the strip shaped laminated first assemblies together.

9. An improved method of manufacturing a solar cell receiver plate as recited in claim 8 further comprising the following step:

(h) attaching cooling fins to the bottom surface of said primary aluminum substrate.

10. An improved method of manufacturing a solar cell receiver plate as recited in claim 8 wherein the electrical circuits of the strip shaped laminated first assemblies are electrically connected together in series.

* * * * *